United States Patent [19]
Bickham et al.

[11] Patent Number: 5,599,144
[45] Date of Patent: Feb. 4, 1997

[54] LOW FRICTION FLUTE TUNGSTEN CARBON MICRODRILL

[75] Inventors: Michael Bickham, Austin; Richard W. Burns, Round Rock; Glenn D. Johnson, Austin; Joe Negron, Hutto; Oliver K. Sparkman, Georgetown; Dale W. Wilhite, Round Rock, all of Tex.

[73] Assignee: International Business Machines Corporation, Armonk, N.Y.

[21] Appl. No.: 494,048

[22] Filed: Jun. 23, 1995

[51] Int. Cl.$^6$ .............................. B23B 51/02; B21K 5/04
[52] U.S. Cl. ......................... 408/144; 76/108.6; 408/230
[58] Field of Search .................................. 408/230, 144, 408/145; 76/108.1, 108.6

[56] References Cited

U.S. PATENT DOCUMENTS

| | | | |
|---|---|---|---|
| 3,945,807 | 3/1976 | Fukutome | 29/182.3 |
| 3,947,143 | 3/1976 | Gulla et al. | 408/230 |
| 4,080,093 | 3/1978 | Maier | 408/230 |
| 4,135,847 | 1/1979 | Hemmings | 408/226 |
| 4,231,692 | 11/1980 | Brabetz et al. | 408/230 |
| 4,561,813 | 12/1985 | Schneider | 408/230 |
| 4,642,003 | 2/1987 | Yoshimura et al. | 408/144 |
| 4,679,971 | 7/1987 | Maier | 408/145 |
| 4,713,286 | 12/1987 | Bunting et al. | 428/323 |
| 4,722,644 | 2/1988 | Scheuch | 408/230 |
| 4,759,667 | 7/1988 | Brown | 408/230 |
| 4,826,365 | 5/1989 | White | 408/144 |
| 4,943,488 | 7/1990 | Sung et al. | 428/552 |
| 5,022,801 | 6/1991 | Anthony et al. | 408/144 |
| 5,068,148 | 11/1991 | Nakahara et al. | 428/335 |
| 5,273,557 | 12/1993 | Cerutti et al. | 51/293 |
| 5,376,444 | 12/1994 | Grotepass et al. | 428/336 |

FOREIGN PATENT DOCUMENTS

| | | | |
|---|---|---|---|
| 0184616 | 11/1982 | Japan | 408/145 |
| 0070178 | 4/1985 | Japan | 408/144 |
| 1146411 | 7/1986 | Japan | 408/145 |
| 0048413 | 3/1987 | Japan | 408/144 |
| 0216706 | 8/1989 | Japan | 408/144 |
| 0048106 | 2/1990 | Japan | 408/230 |
| 0098709 | 4/1991 | Japan | 408/144 |

OTHER PUBLICATIONS

Research Report, "Tribological Properties of Diamond–Like Carbon and Related Materials", Jul. 15, 1992, IBM Research Division, Grill et al, pp. 1–12.

*Surface and Coatings Technology*, 1st European Conference on Diamond and Diamond–like Carbon Coatings, Switzerland, Sep. 17–19, 1990, "Tribological properities and characterization of diamond–like carbon coatings with silicon prepared by plasma–assisted chemical vapour deposition", Oguri et al, pp. 710–721.

*Materials Science and Engineering*, Italy, Bll (1992), "Influence of silicon on the physical properties of diamond–like films" Demichelis et al, pp. 313–316.

*Materials Science and Engineering*, Japan, Bll (1992), "Limits to diamond and diamond–like material properties produced under metastable conditions", Kamo et al, pp. 191–196.

*Surface and Coatings Technology*, Japan, 43/44, 1990, "The improvement of the adhesion strength diamond films", Saijo et al, pp. 30–40.

*Annals of the CIRP*, vol. 42/2/1993, Switzerland, H. E. Hintermann et al, pp. 769–783.

Primary Examiner—Steven C. Bishop
Attorney, Agent, or Firm—Casimer K. Salys

[57] ABSTRACT

A drill bit, and associated method of manufacture, characterized by the presence of a low friction coating on the drill flute surfaces and the absence of such coating from the facets on the cutting surfaces of the drill bit. In one form, a tungsten carbide based microdrill bit is coated with a high temperature diamond like carbon to a layer thickness measured in microns. The cutting facets of the microdrill bit are then ground to expose the tungsten carbide material. The microdrill bit formed thereby is particularly useful in creating holes through multilayer printed circuit boards as a part of forming electrical vias. Low friction flute surface coated microdrills exhibit materially longer drill life, better drill location accuracy, can operate at materially greater chiploads, and produce higher quality holes through printed circuit boards.

14 Claims, 1 Drawing Sheet

LOW FRICTION FLUTE TUNGSTEN CARBON MICRODRILL

BACKGROUND OF THE INVENTION

The present invention relates in general to drill bits. More particularly, the invention is directed to a selective coating which improves the performance of microdrills.

Multilayer electronic printed circuit boards require electrical interconnections between the copper patterns in the various layers. These interconnections, commonly called vias or plated through holes, convey the electrical power, electrical ground and processed signals between the circuits defined by the various board layers. The actual connection from layer to layer is accomplished by forming copper plating in holes drilled through the board, the locations of such holes thereby defining the interconnections between the lovers. As electronic devices shrink in size and increase in operating frequency, the individual sizes and numbers of holes per square inch of board surface continue to increase. In conventional practice, the holes which define the locations of the vias are drilled using high speed small diameter drill bits, commonly referred to as microdrills.

The conventional process for making vias in printed circuit boards has two aspects. First, a mechanical process, called drilling, is used to create the holes in the fiberglass/copper laminate of the multilayer board. Thereafter, a chemical process, called plating, forms conductive copper in the mechanically drilled holes. Therefore, the quality of the hole drilling process directly effects the quality of the via formed in the board, in terms of hole location accuracy and hole smoothness.

It is not unusual to have approximately 20 percent of printed circuit board plant capital invested in mechanical drilling process equipment. In relative comparison to other aspects of the printed circuit board manufacturing, the drilling process is slow. Each hole is drilled in succession on a drilling machine which maintains the high degree of precision required for miniaturized multiple layer printed circuit boards. A typical machine drills approximately three holes per second at a nominal chip load.

Printed circuit board industry microdrill bits vary in diameter from approximately 0.1 to 0.5 millimeters. Industry standard twist type microdrill bits are fabricated from 92 percent tungsten carbide crystals cemented with an 8 percent cobalt binder. The tungsten carbide exhibits wear resistance suitable for cutting through laminated printed circuit boards having multiple epoxy, copper and silicon glass layers. In typical usage such microdrills are capable of making approximately 1100 holes before they must be replaced or resharpened. Industry wide the range varies from 1000–2000 holes.

Investigation has confirmed that only the cutting surface of the microdrill requires the toughness provided by the tungsten carbide. The prevailing use of 92 percent tungsten carbide is the result of empirical studies undertaken to reduce the hole formation time by increasing the drill speed and the penetration rate during the drilling process. Attempts to increase the tungsten carbide content of the drill bits, in pursuit of higher drill speeds and better hole location accuracy, has proven unsuccessful because of the effects of the board chips being removed during the drilling process. As the cutting rate is increased, the chips bind in the drill bit flutes, causing rough holes or catastrophic breakage of the drill bits. The latter effect typically results in the scrap of the printed circuit board.

The shrinking dimensions of printed circuit boards also accentuates the importance of hole location accuracy. Conventional microdrills, when used to simultaneously drill holes through three stacked printed circuit boards, provide a 3 sigma location accuracy of approximately 0.075 millimeters. Investigation of microdrill bit compositions show that higher concentrations of tungsten carbide lead to better location accuracy. However, such higher concentrations also result in rougher holes and higher occurrences of drill bit breakage, as described earlier.

Accordingly, what is needed is a microdrill bit design which maintains or improves hole location accuracy, improves hole roughness, allows faster hole formation, and extends the life of microdrill bits between resharpening cycles.

SUMMARY OF THE INVENTION

The problems characterizing the prior art are overcome through the use of a low friction flute tungsten carbide based microdrill bit. The microdrill bit is made by fabricating a fluted twist drill with tungsten carbide, coating the microdrill surfaces with a very low friction material, and exposing the tungsten carbide at the facets of the cutting surfaces of the twist drill. The twist drill itself is characterized by a high tungsten carbide content, a fluted drill body, a thin layer of very low friction material coating the flute surfaces of the drill, and exposed tungsten carbide at the facets of the cutting point.

In a particularized form of the invention, a 94 percent tungsten carbide microdrill body is coated by chemical vapor deposition to a nominal thickness between 1 and 6 microns with a silicon enhanced diamond like carbon (known as high temperature diamond like carbon). The drill point is then sharpened to expose the tungsten carbide on the primary and secondary facets. The silicon enhanced high temperature diamond like carbon coating remains on the microdrill in regions other than the cutting point. The low friction of the silicon enhanced high temperature diamond like carbon materially improves the chip removal characteristics of the microdrill bit flutes, as particularly characterized in reduced binding and lower microdrill bit temperatures. Though the silicon enhanced high temperature diamond like carbon is initially present on the margins and relief of the microdrill body, and contributes in such locations to reduced friction, these deposits tend to wear off with drill usage. Nevertheless, the particularly beneficial deposit within the flutes remains during the life of the drill in adequate amounts to materially reduce the friction along the flute surfaces and thereby facilitate chip movement from the cutting point of the microdrill bit.

The low friction coating of the flute surfaces, in combination with the higher tungsten carbide ratio facilitated by the low friction flutes, provides microdrill bits which exhibit better hole location accuracy, a nominal 40 percent increase in chipload capability, and an extended bit life between resharpenings. As a consequence, drill equipment throughput of printed circuit board manufacturers increases dramatically while microdrill replacement costs decrease.

These and other features of the invention will be more clearly understood and appreciated upon considering the detailed embodiment which follows.

DESCRIPTION OF THE PREFERRED EMBODIMENT

Figure 1:
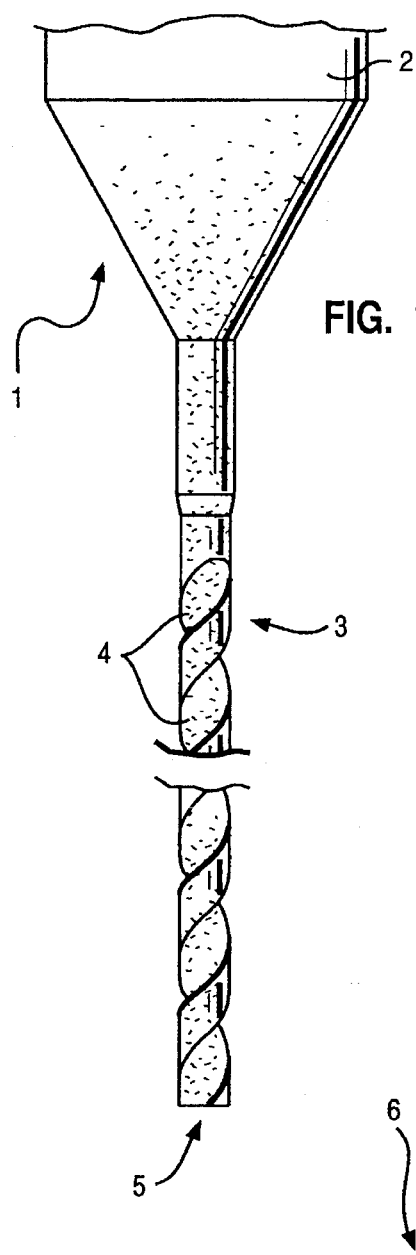
FIG. 1 depicts a microdrill bit coated with high temperature diamond like carbon before sharpening.

Tungsten carbide based microdrills are routinely used to create holes in electronic printed circuit boards. In selecting the shape and composition of the microdrill bits, tradeoffs are made to balance microdrill life between resharpening cycles, microdrill location accuracy, chipload, and the hole quality. For example conventional microdrill bits, namely those in the diameter ranging from 0.1 to 0.5 millimeters, exhibit an average drill life of materially less than 1500 holes between resharpening, a typical three sigma drill location accuracy of 0.075 millimeters, and a nominal chipload of approximately 1 mil. This performance is representative for a microdrill bit composed of 92 percent tungsten carbide crystal cemented with 8 percent cobalt binder.

The present invention overcomes the performance limitation of the prior art by recognizing the importance of flute surface friction and by developing a unique low friction and high temperature capability coating for the flute surfaces. The combination provides a microdrill design which exhibits an extended life between resharpening, improved drill location accuracy, materially increased chipload capability, reduced drill breakage, and improved quality of the via holes formed in printed circuit boards. The key elements to the microdrill bit according to the present invention reside in the use of a high temperature capability low friction coating on the drill flute surfaces, and the absence of such coating from the cutting point facets of the microdrill bit.

Investigation of the drilling phenomenon as pertains to the use of microdrill bits to form via holes in printed circuit boards led to the conclusion that flute surface friction was a material and constraining parameter to faster, more accurate and better hole formation. An evaluation of coating materials identified high temperature diamond like carbon as having adequate wear resistance, adequate temperature capability, and a uniquely low coefficient of friction. Though plain amorphous carbon, in the form generally known as diamond like carbon, exhibits the desired low friction, the diamond like carbon is not capable of performing at typical printed circuit board drilling temperatures. Microdrill flute surfaces routinely produce temperatures ranging from 350 to 450 degrees C. However, silicon enhanced diamond like carbon does provide the high temperature capabilities required for the flute surfaces while continuing to exhibit the low friction and high wear resistance characterizing diamond like carbon coatings.

Testing of microdrill bits with silicon enhanced diamond like carbon coated flute surfaces confirmed that the low friction allows a chipload increase of approximately 40 percent. Additionally, the higher drill feed rate results in lower drill wear. Furthermore, with the low friction coated flutes it is possible to increase the tungsten carbide content of the drill material to 94 percent, further improving the wear resistance of the microdrill tip. Together, the microdrill bit average life increases from approximately 1,100 hole forming hits to approximately 6,000 hole forming hits before the need for resharpening.

The change in the tungsten carbide content to 94 percent al so improves the drill location accuracy from the present 3 sigma of 0.075 millimeters to approximately 0.05 millimeters. That improvement, however, follows the recognition that the cutting point surfaces at the microdrill tip must be clean of the coating material. It is believed that retention of the low friction coating material on the drill point cutting surfaces increases the effective skidding of the drill point, effectively decreasing the hole location accuracy.

FIG. 1 depicts a microdrill bit 1 of the type to which the present invention pertains. The microdrill shank 2 is significantly larger in diameter than the microdrill body 3. Microdrill body 3 is preferably composed of 94 percent silicon carbide crystal cemented with 6 percent cobalt binder. The microdrill body 3, but not shank 2, is coated with a silicon enhanced diamond like carbon to a thickness nominally ranging from 1 to 6 micrometers. This is shown by stippling in FIG. 1. To simplify the coating process, the bit in FIG. 1 is shown to have the coating applied over the whole body 3 of the microdrill. The key aspect of the invention is that the low friction coating be present on at least flutes 4 of bit 1. Given the greater contact of the outer surfaces during the forming of holes, after some usage the low friction coating material will remain solely on the flute surfaces. FIG. 1 depicts the drill bit before sharpening of the point surfaces at cutting end 5.

Formation of the silicon enhanced high temperature diamond like carbon coating may be performed in the manner described in the article authored by Oguri et al, entitled "Tribological Properties and Characterization of Diamond-Like Carbon Coatings with Silicon Prepared by Plasma-Assisted Chemical Vapour Deposition" as appeared in *Surface and Coatings Technology*, Volume 47, Pages 710–721 in 1991. The subject matter thereof is incorporated herein by reference. As described by Oguri et al, high purity gases of $CH_4$, $SiCl_4$, $H_2$ and argon are introduced into the chemical vapor deposition chamber while the chamber pressure is at 4 Torr. The flow rate of $H_2$ is at 750 cubic centimeters per minute and argon is at 500 cubic centimeters per minute, while the $CH_4$ flow rate is varied from 0 to 80 cubic centimeters per minute and the $SiCl_4$ flow rate is varied from 0 to 7.5 cubic centimeters per minute. The deposition temperature is maintained at 550 degrees C. The DC voltage and current used to create the plasma range from 330 to 440 volts and 1.5 to 2 amps, respectively, depending on the flow rate of the $CH_4$ and $SiCl_4$, as needed to maintain the constant temperature. Under those conditions the coating deposits at a rate of 1–4 micrometers per hour. Obviously, other deposition practices could produce similar coatings, the key objective being a low friction coating on the microdrill flute surfaces.

Evaluation of various coatings for friction characteristics has established that amorphous carbon, and in particular silicon enhanced high temperature diamond like carbon, exhibits a low friction coefficient of approximately 0.015. In distinct contrast, the friction coefficient of tungsten carbide is approximately 0.9, greater by a factor of approximately 6. Other durable chemical vapor deposited coatings, such as polycrystalline diamond, also have relatively high coefficients. For example, a polycrystalline diamond surface is 0.4 as deposited and 0.02 after polishing. Polishing of flute coatings is not particularly desirable.

Figure 2:
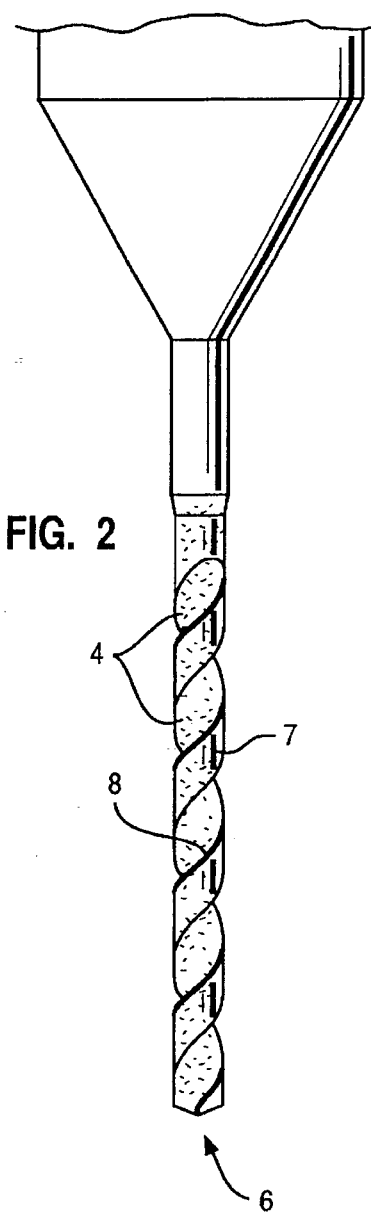
FIG. 2 depicts a preferred microdrill bit after point preparation sharpening.

FIG. 2 depicts a preferred arrangement of a completed microdrill bit. As shown, the silicon enhanced high temperature diamond like carbon coating exists on the surfaces of flutes 4, drill reliefs 7 and drill margins 8. However, the coating is absent from the cutting point facets at microdrill point 6 as a result of masking during deposit, etching off after deposition, or the preferred process of removal during drill point sharpening.

Figure 3:
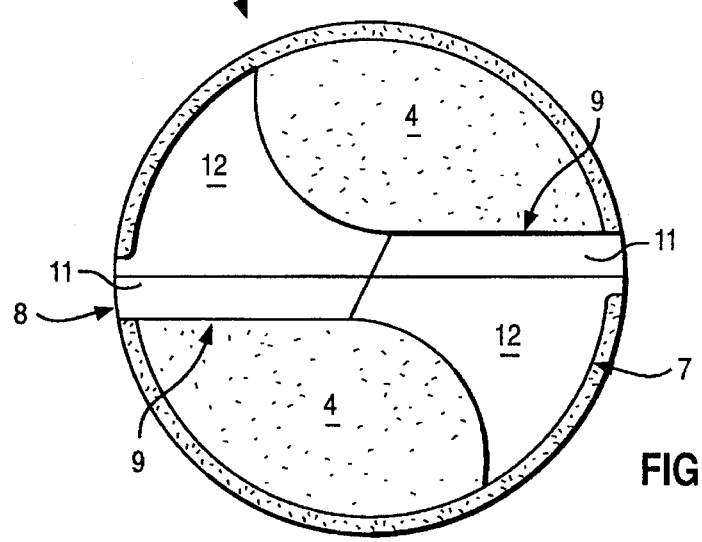
FIG. 3 depicts a microdrill bit as viewed from the point, showing the uncoated facets.

A magnified illustration of microdrill bit point 6 appears in FIG. 3. As shown, the microdrill has two flutes at 4 which receive the chips removed by cutting edges 9 of primary facets 11. Secondary facets 12 peel and direct the cut chips into flutes 4 as the microdrill bit rotates. Note in particular that the primary and secondary facets 11 and 12 are exposed tungsten carbide.

As would be expected with drill usage, the high contact surfaces, relief 7 and margin 8, lose their coatings relatively early in the microdrill bit life. Though these surfaces initially assist in reducing the microdrill bit friction, and thereby associated heating of the bit, the key feature of the invention is the presence of a low friction, preferably silicon enhanced high temperature diamond like carbon coating, on the flute surfaces of the microdrill bit. Therefore, whether the low friction coating is deposited selectively on the flutes or remains solely on the flutes as a consequence of wear, it is the combination of the coated flute surfaces and the absence of coating from the drill point cutting surfaces that characterize the present invention.

The selective presence of a low friction coating on microdrill bit flute surfaces and not on the cutting surfaces of the point improves microdrill life by approximately a factor of 5, improves location accuracy by approximately 30 percent, and increases the chipload by approximately 40 percent, while decreasing microdrill breakage and improving printed circuit board hole quality. Given the trend toward smaller dimensions, these improvements are critical to the efficient manufacture of advanced printed circuit boards with via holes.

The invention has been described and illustrated by way of specific embodiments, the methods and apparatus encompassed by the invention should be interpreted to be in keeping with the breadth of the claims as set forth hereinafter.

We claim:

1. A method of making a drill bit, comprising the steps of:

fabricating a fluted drill with tungsten carbide;

depositing a thin layer of low coefficient of friction silicon enhanced high temperature diamond like carbon on drill surfaces; and exposing the tungsten carbide at cutting surfaces of the drill while retaining the thin layer of high temperature diamond like carbon at drill flute surfaces.

2. The method recited in claim 1, wherein:

the depositing step comprises a vapor deposition of silicon enhanced high temperature diamond like carbon performed at a nominal temperature of 550 degrees centigrade or less; and the exposing step comprises selectively removing the layer of high temperature diamond like carbon from the cutting surfaces.

3. The method recited in claim 1, wherein the layer of high temperature diamond like carbon is nominally 1–10 micrometers thick.

4. The method recited in claim 2, wherein the layer of high temperature diamond like carbon is nominally 1–10 micrometers thick.

5. The method recited in claim 3, wherein the exposing step comprises a drill point sharpening operation.

6. The method recited in claim 4, wherein the exposing step comprises a drill point sharpening operation.

7. The method recited in claim 5, wherein:

the drill has two flutes;

the drill composition is nominally 94 percent tungsten carbide crystal and 6 percent cobalt binder; and the drill diameter is nominally 0.5 millimeters or less.

8. The method recited in claim 6, wherein:

the drill has two flutes;

the drill composition is nominally 94 percent tungsten carbide crystal and 6 percent cobalt binder; and the drill diameter is nominally 0.5 millimeters or less.

9. A drill bit, comprising:

a fluted drill body composed substantially of tungsten carbide;

a thin layer of very low friction silicon enhanced high temperature diamond like carbon material deposited on surfaces of the drill body; and selectively exposed tungsten carbide at the facets of the cutting surfaces of the drill body.

10. The drill bit recited in claim 9, wherein:

the thin layer is a vapor deposition of silicon enhanced high temperature diamond like carbon formed at a nominal temperature of 550 degrees centigrade or less; and the selectively exposed tungsten carbide is at the sharpened point of the drill body.

11. The drill bit recited in claim 9, wherein the thin layer is nominally 1–10 micrometers thick.

12. The drill bit recited in claim 10, wherein the thin layer is nominally 1–10 micrometers thick.

13. The drill bit recited in claim 11, wherein:

the drill body has two flutes;

the drill body composition is nominally 94 percent or greater tungsten carbide crystal and 6 percent or less cobalt binder; and the drill body diameter is nominally 0.5 millimeters or less.

14. The drill bit recited in claim 12, wherein:

the drill body has two flutes;

the drill body composition is nominally 94 percent or greater tungsten carbide crystal and 6 percent or less cobalt binder; and the drill body diameter is nominally 0.5 millimeters or less.

* * * * *